United States Patent
Benaissa et al.

(10) Patent No.: US 6,847,095 B2
(45) Date of Patent: Jan. 25, 2005

(54) VARIABLE REACTOR (VARACTOR) WITH ENGINEERED CAPACITANCE-VOLTAGE CHARACTERISTICS

(75) Inventors: Kamel Benaissa, Dallas, TX (US); Abdellatif Bellaouar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 10/405,568

(22) Filed: Apr. 1, 2003

(65) Prior Publication Data

US 2004/0195643 A1 Oct. 7, 2004

(51) Int. Cl.[7] .............................................. H01L 29/93
(52) U.S. Cl. ........................ 257/601; 257/312; 438/379
(58) Field of Search ........................ 257/312, 595–602; 438/379

(56) References Cited

U.S. PATENT DOCUMENTS

| | | | |
|---|---|---|---|
| 6,407,412 B1 | 6/2002 | Iniewski et al. | 257/107 |
| 6,538,519 B2 * | 3/2003 | Lo et al. | 331/17 |
| 2002/0074589 A1 * | 6/2002 | Benaissa et al. | 257/312 |
| 2003/0136992 A1 * | 7/2003 | Adan | 257/300 |

* cited by examiner

Primary Examiner—Long Pham
Assistant Examiner—Marcos D. Pizarro-Crespo
(74) Attorney, Agent, or Firm—Yingsheng Tung; Wade James Brady, III; Frederick J. Telecky, Jr.

(57) ABSTRACT

In one embodiment, a varactor includes a first node and a second node. The varactor includes: at least one first varactor element including a source, a drain, and a p-type doped gate; at least one second varactor element including a source, a drain, and an n-type doped gate; and at least one third varactor element including a source, a drain, and an intermediately doped gate, the intermediately doped gate having doping characteristics intermediate to doping characteristics of the p-type and n-type gates. The varactor includes one or more wells in a substrate region underlying the first, second, and third varactor elements. The first, second, and third varactor elements are coupled in parallel between the first and second nodes.

24 Claims, 8 Drawing Sheets

US 6,847,095 B2

VARIABLE REACTOR (VARACTOR) WITH ENGINEERED CAPACITANCE-VOLTAGE CHARACTERISTICS

TECHNICAL FIELD OF THE INVENTION

This invention relates generally to semiconductor devices and more particularly to a variable reactor (varactor) with engineered capacitance-voltage characteristics.

BACKGROUND OF THE INVENTION

A varactor is generally a semiconductor device designed to take advantage of variations in its reactance. A varactor may be thought of as a variable voltage capacitor. As a voltage is applied to a varactor, the capacitance of the varactor generally increases. Certain varactors may be used in various types of tuning circuits. As an example, varactors may be useful in certain oscillator circuits, such as oscillator circuits commonly used in communications devices. The operating frequency of an LC oscillator circuit, for example, may be controlled or tuned by varying the voltage across the terminals of a varactor. As another example, varactors may be used in the tuning mechanism of a radio receiver or another device requiring frequency tuning. Two types of varactors include metal oxide semiconductor (MOS) varactors and junction-diode varactors. MOS varactors generally have a higher tuning range than junction-diode varactors, while junction-diode varactors generally exhibit more linear behavior than MOS varactors on their associated capacitance-voltage (C-V) curves.

SUMMARY OF THE INVENTION

According to the present invention, disadvantages and problems associated with previous varactors may be reduced or eliminated.

In one embodiment, a varactor is provided that includes a first node and a second node. The varactor includes: at least one first varactor element including a source, a drain, and a p-type doped gate; at least one second varactor element including a source, a drain, and an n-type doped gate; and at least one third varactor element including a source, a drain, and an intermediately doped gate, the intermediately doped gate having doping characteristics intermediate to doping characteristics of the p-type and n-type gates. The varactor includes one or more wells in a substrate region underlying the first, second, and third varactor elements. The first, second, and third varactor elements are coupled in parallel between the first and second nodes.

Particular embodiments of the present invention may provide one or more technical advantages. For example, in certain embodiments, a varactor including at least one first varactor element that includes a p-type doped gate, at least one second varactor element that includes an n-type doped gate, and at least one third varactor element that includes an intermediately doped gate may provide both a good tuning range and good linearity relative to previous varactors. In certain embodiments, adjusting the number of first varactor elements, the number of second varactor elements, and the number of third varactor elements may allow the engineering of a desired C-V curve, specifically the engineering of the tuning range and the linearity. In certain embodiments, instead or in addition, adjusting the doping of the sources and drains for the first, second, and third varactor elements and the doping of the one or more wells underlying the varactor elements may allow the engineering of a desired C-V curve, specifically the engineering of the tuning range and the linearity.

Certain embodiments of the present invention may provide some, all, or none of the above technical advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

Figure 1A:
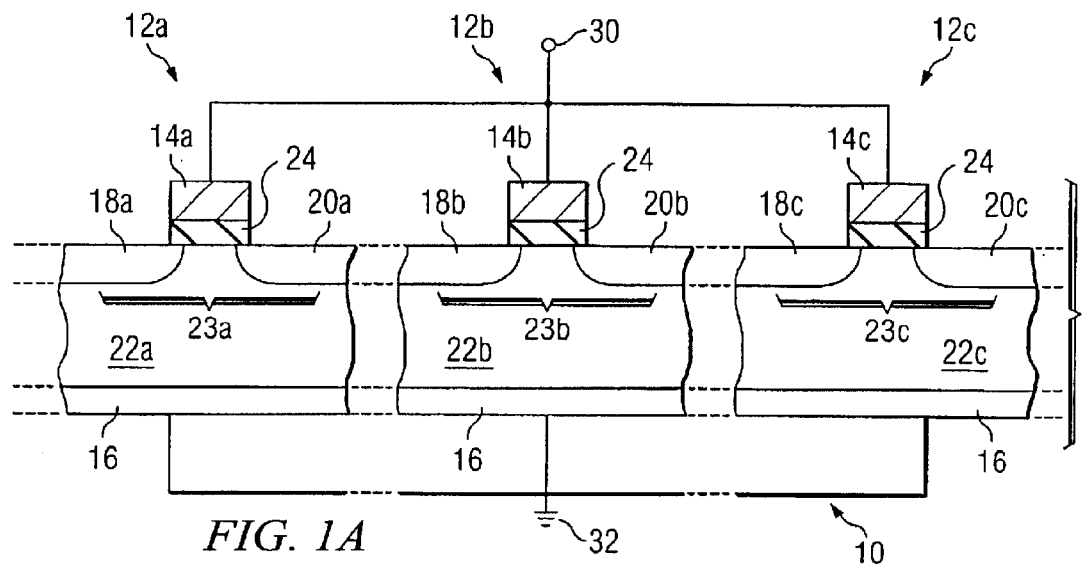
FIGS. 1A and 1B illustrate cross-sectional and top views of a portion of an example MOS varactor including one or more first varactor elements each having a p-type doped gate, one or more second varactor elements each having an n-type doped gate, and one or more third varactor elements each having an intermediately doped gate having doping characteristics intermediate to doping characteristics of the p-type doped gate and n-type doped gate.
Figure 1B:
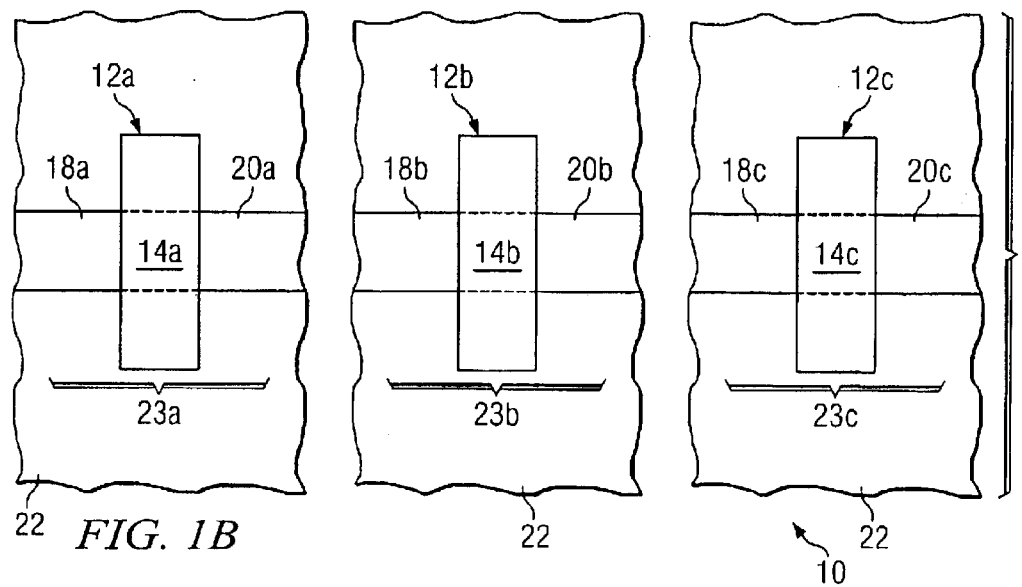

FIGS. 1A and 1B illustrate cross-sectional and top views of a portion of an example MOS varactor 10 including one or more varactor elements 12a each having a p-type doped gate 14a, one or more varactor elements 12b each having an n-type doped gate 14b, and one or more varactor elements 12c each having an intermediately doped gate 14c having doping characteristics intermediate to doping characteristics of p-type doped gate 14a and n-type doped gate 14b. Varactor 10 may be incorporated in an integrated circuit or other suitable device according to particular needs. For example, varactor 10 may be one of a number of semiconductor devices within an integrated circuit that may be used to provide frequency tuning within an electronic device. At a general level, the integrated circuit may include varactor 10, one or more components to supply a variable voltage to varactor 10, and one or more components to provide frequency tuning according to the capacitance associated with varactor 10 in response to the variable voltage. Varactor 10 may be formed on a silicon or other substrate region 16. In certain embodiments, substrate region 16 may be n-type doped or p-type doped.

Gates 14 may be formed from polysilicon or any other suitable material. P-type doped gate 14a of varactor element 12a may include boron, boroflouride ($BF_2$), or any other suitable doping material according to particular needs. N-type doped gate 14b of varactor element 12b may include phosphorous or any other suitable doping material according to particular needs. Intermediately doped gate 14c of varactor element 12c may have any suitable doping characteristics intermediate to doping characteristics of p-type doped gate 14a and n-type doped gate 14b. In one embodiment, intermediately doped gate 14c includes an undoped gate 14, the doping characteristics in this case being that there is no doping. In other embodiments, intermediately doped gate 14c may be p-type doped, though less so than p-type doped gate 14a, or n-type doped, though less so than n-type doped gate 14b. Gates 14 may have any suitable dimensions according to particular needs.

Each varactor element 12 may include a source 18 and a drain 20. Sources 18 may include p-type doping, n-type doping, or any other suitable type of doping. Drains 20 may include p-type doping, n-type doping, or any other suitable type of doping. For each varactor element 12, an active region 23 may include at least a portion of source 18, at least a portion of drain 20, and an area underlying gate 14. In one embodiment, two or more varactor elements 12 may share a common active region 23. Active regions 23 may have any suitable dimensions according to particular needs. One or more wells 22 may be formed in substrate region 16 underlying varactor elements 12 and may include p-type doping, n-type doping, or any other suitable doping characteristics. In certain embodiments, it may be desirable for substrate region 16 and well 22 to have different types of doping. For example, in an embodiment in which substrate region 16 includes p-type doping, it may be desirable for well 22 to include n-type doping. As another example, in an embodiment in which substrate region 16 includes n-type doping, it may be desirable for well 22 to include p-type doping. For simplicity, the remainder of this description will assume well 22 includes n-type doping. Source 18, drain 20, and well 22 may include the same or different type of doping. In certain embodiments, it may be desirable for varactor 10 to include one well 22 for all varactor elements 12, the one well 22 including the same type of doping throughout. In one embodiment, varactor elements 12 may each include a gate-insulating layer 24, such as an oxide layer, between at least a portion of gate 14 and at least a portion of source 18, drain 20, and well 22.

Varactor elements 12a, 12b, and 12c may be coupled in parallel between a first node 30 and a second node 32. In one embodiment, first node 30 may be coupled to a voltage source and second node 32 may be coupled to ground, such that a voltage potential is applied across varactor 10. Although only one first node 30 and one second node 32 are shown, the present invention contemplates any suitable number of first nodes 30 and second nodes 32 according to particular needs. Furthermore, although first node 30 and second node 32 are shown connected to varactor 10 in a particular fashion, first node 30 and second node 32 may be connected to varactor 10 and the varactor elements 12 of varactor 10 in any suitable fashion.

Each varactor element 12 may be associated with a capacitance-voltage (C-V) curve that would illustrate the change in capacitance of varactor element 12 if a variable voltage was applied to varactor element 12 in isolation. For example, varactor element 12a including p-type doped gate 14a may be associated with a first C-V curve, varactor element 12b including n-type doped gate 14b may be associated with a second C-V curve, and varactor element 12c including intermediately doped gate 14c may be associated with a third C-V curve. Varactor 10 including one or more of each of varactor elements 12a, 12b, and 12c may exhibit a composite C-V curve reflecting a combination of the first, second, and third C-V curves when a voltage is applied between first node 30 and second node 32. According to the present invention, the composite C-V curve associated with varactor 10 may be engineered according to the number and types of varactor elements 12 and the doping characteristics of their components.

Figure 2:
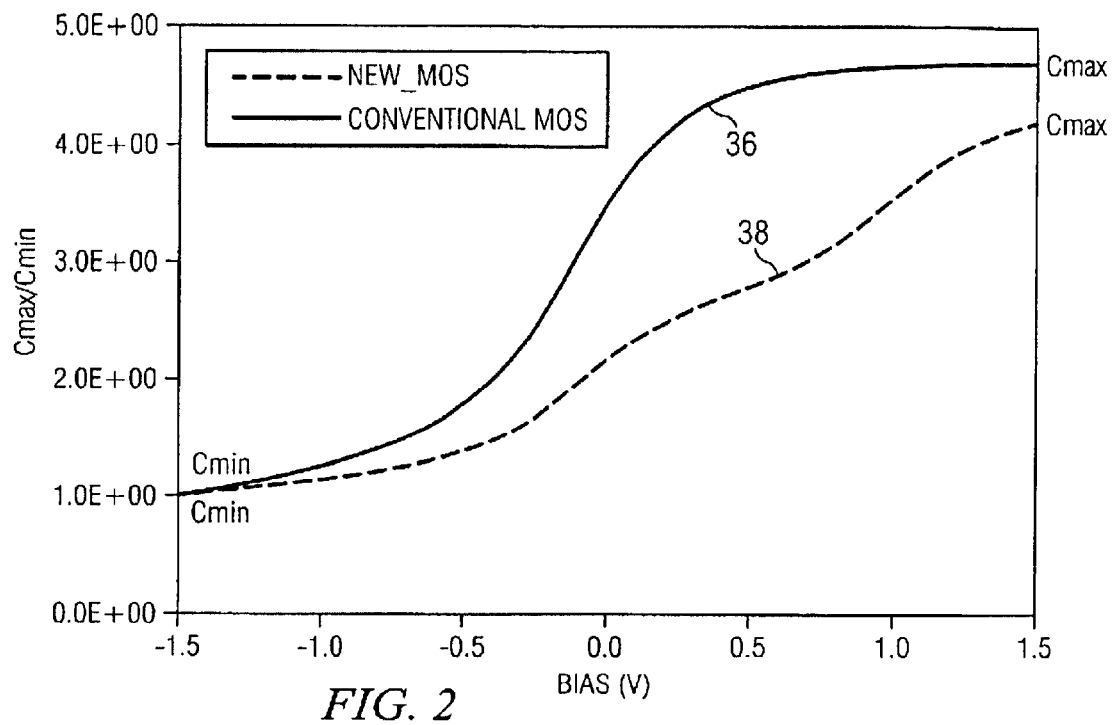
FIG. 2 illustrates an example capacitance voltage (C-V) curve for a conventional varactor and an example composite C-V curve for a varactor constructed according to the teachings of the present invention.

FIG. 2 illustrates example C-V curves 36 and 38. C-V curve 36 illustrates a particular example of a C-V curve for a conventional varactor that includes an n-type doped gate 14b and also a source 18b and drain 20b that include n-type doping. C-V curve 36 for the conventional varactor having these doping characteristics may exhibit a relatively large difference between its $C_{max}$ and $C_{min}$ values, which may indicate a relatively large tuning range. However, C-V curve 36 may exhibit relatively poor linearity, which may be undesirable. In contrast, C-V curve 38 illustrates a particular example of a C-V curve for a varactor 10 that includes one or more varactor elements 12a, one or more varactor elements 12b, and one or more varactor elements 12c according to the present invention. In one embodiment, C-V curve 38 may exhibit a range in its $C_{max}$ and $C_{min}$ substantially similar to C-V curve 36, which may indicate a relatively large tuning range. Although FIG. 2 illustrates C-V curve 38 having an example $C_{max}$–$C_{min}$ range that is approximately ninety percent of the example $C_{max}$–$C_{min}$ range of C-V curve 36, the present invention contemplates C-V curve 38 having any $C_{max}$–$C_{min}$ range. Additionally, C-V curve 38 may exhibit increased linearity relative to C-V curve 36. Although FIG. 2 illustrates C-V curve 38 having an example degree of linearity relative to the example linearity (or non-linearity) of C-V curve 36, the present invention contemplates C-V curve 38 having any degree of linearity. Using a varactor with a combination of a substantially similar tuning range and increased linearity relative to a conventional varactor may be desirable in certain applications.

Returning to FIG. 1, varactor 10 may include any suitable number of varactor elements 12 and any suitable combination of varactor elements 12a, varactor elements 12b, and varactor elements 12c according to particular needs. As just one example varactor 10 constructed according to the present invention, source 18a and drain 20a of varactor element 12a may include p-type doping, source 18b and drain 20b of varactor element 12b may include n-type doping, and source 18c and drain 20c of varactor element 12c may include intermediate-type doping having doping characteristics intermediate to those of sources 18a and 18b and drains 20a and 20b of varactor elements 12a and 12b, respectively. FIGS. 3–12, described below, illustrate additional example varactors 10 constructed according to the present invention.

A manufacturer of a varactor 10 may base the number, size, and combination of varactor elements 12 in the varactor 10, and the doping characteristics of their components, on the desired tuning range and linearity of the C-V curve associated with varactor 10. For example, a varactor 10 having a predetermined tuning range and a predetermined linearity may be desired. The number, size, and combination of varactor elements 12 of varactor 10 may be adjusted to achieve the predetermined tuning range and the predetermined linearity. In one embodiment, the C-V curve associated with varactor 10 may engineered according to one or more of the following: the number of varactor elements 12a, the number of varactor elements 12b, the number of varactor elements 12c, the doping of gates 14 for varactor elements 12, the doping of sources 18 and drains 20 (i.e. active regions 23) for varactor elements 12, and the doping of the one or more wells 22. In certain embodiments, $C_{total}=a*n+b*p+c*i$, where a, b, and c may be weight factors necessary to engineer a predetermined C-V curve and n, p, and i may be the unit capacitors for n-type doped gate 14b, p-type doped gate 14a, and intermediately doped gate 14c. A, b, c, n, p, and i may be optimized to engineer the C-V curve.

Particular embodiments of the present invention may provide one or more technical advantages. For example, in certain embodiments, a varactor 10 that includes at least one varactor element 12a that includes p-type doped gate 14a, at least one varactor element 12b that includes n-type doped gate 14b, and at least one varactor element 12c that includes intermediately doped gate 14c may provide both a good tuning range and good linearity relative to previous varactors. In certain embodiments, adjusting the number of varactor elements 12a, the number of varactor elements 12b, and the number of varactor elements 12c may allow the engineering of a desired C-V curve, specifically the engineering of the tuning range and the linearity. In certain embodiments, instead or in addition, adjusting the doping of sources 18 and drains 20 for varactor elements 12a, 12b, and 12c and the doping of the one or more wells 22 underlying varactor elements 12 may allow the engineering of a desired C-V curve, specifically the engineering of the tuning range and the linearity.

FIGS. 3 through 12 illustrate example varactors 10 in accordance with the teachings of the present invention. Although these example varactors 10 may include specific numbers, arrangements, and characteristics of varactor elements 12, varactor elements 12 may be provided in any suitable number, in any suitable arrangement, and with any suitable doping characteristics as discussed above.

Figure 3:
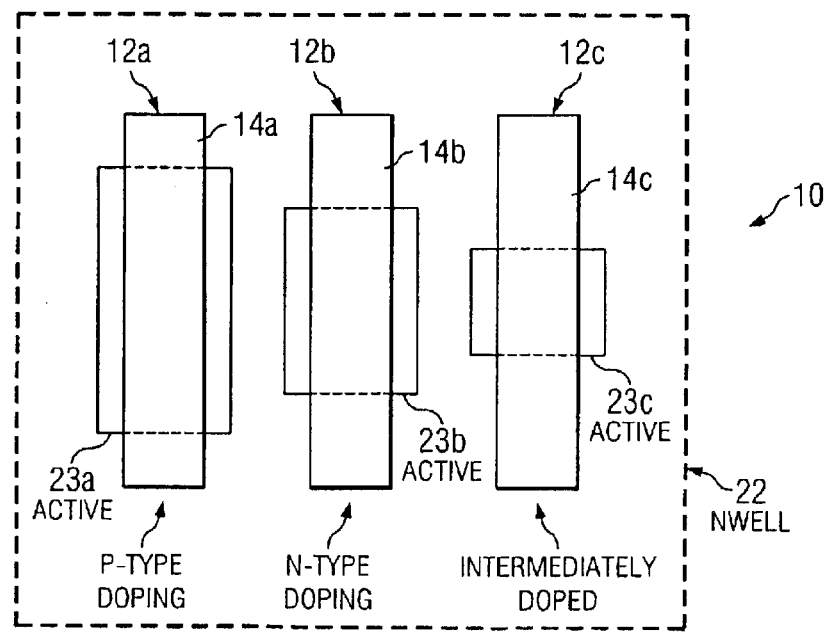
FIG. 3 illustrates an example varactor that includes one first varactor element, one second varactor element, and one third varactor element 12c.

FIG. 3 illustrates an example varactor 10 that includes one varactor element 12a, one varactor element 12b, and one varactor element 12c. A common well 22 includes n-type doping. Source 18a and drain 20a of varactor element 12a include p-type doping, source 18b and drain 20b of varactor element 12b include n-type doping, and source 18c and drain 20c of varactor element 12c include intermediate-type doping. Active regions 23 may vary in size as illustrated or may be substantially similar in size, according to particular needs.

Figure 4:
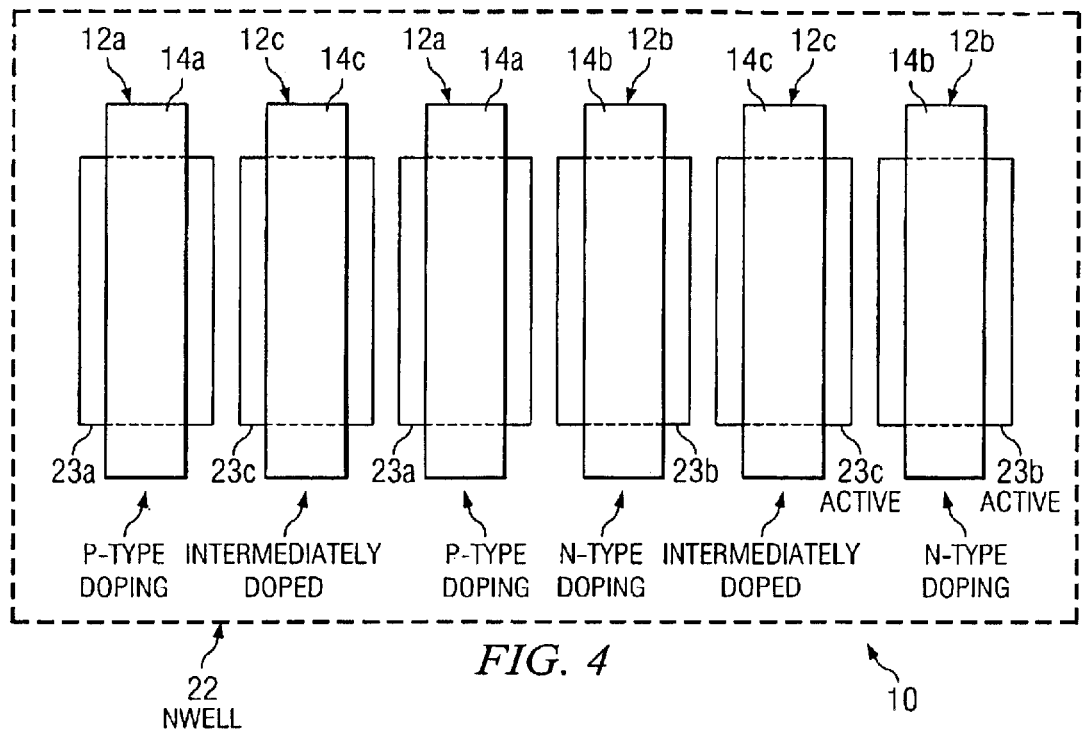
FIG. 4 illustrates an example varactor that includes two first varactor elements, two second varactor elements, and two third varactor elements with separate similarly sized active regions for each varactor element.

FIG. 4 illustrates an example varactor 10 that includes two varactor elements 12a, two varactor elements 12b, and two varactor elements 12c with separate similarly sized active regions 23 for each varactor element 12. A common well 22 includes n-type doping. Sources 18a and drains 20a of varactor elements 12a include p-type doping, and sources 18b and drains 20b of varactor elements 12b include n-type doping, and sources 18c and drains 20c of varactor elements 12c may include intermediate-type doping. Active regions 23 may be substantially similar in size as illustrated or may vary in size, according to particular needs.

Figure 5:
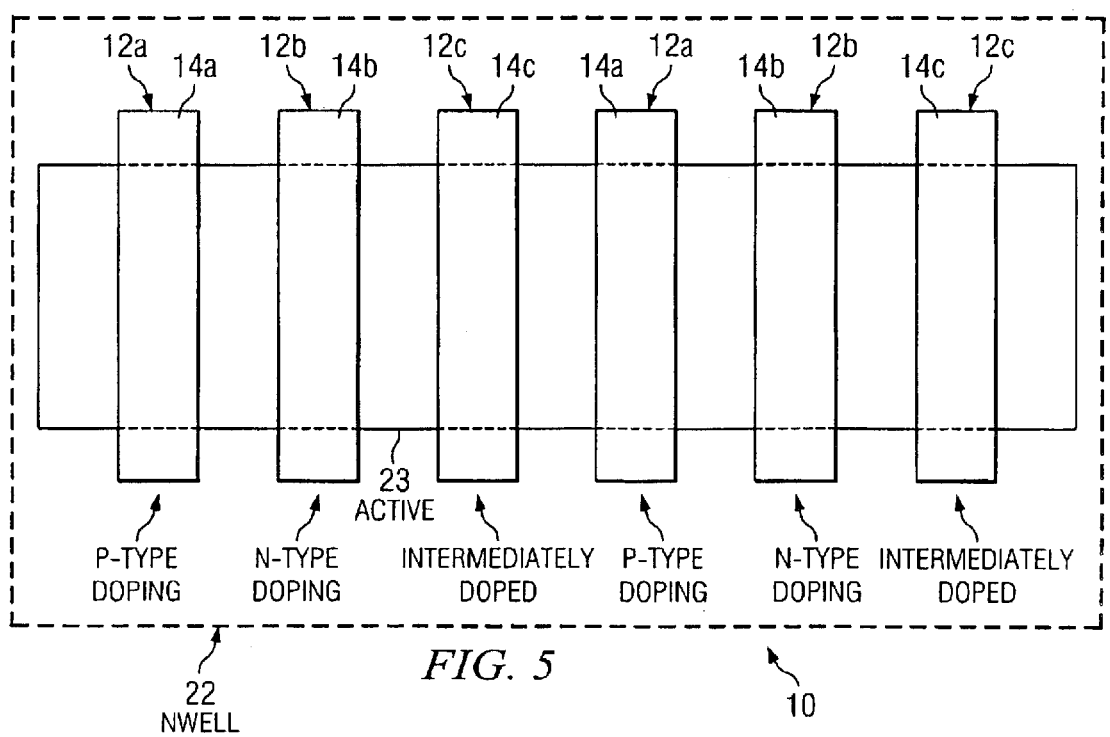
FIG. 5 illustrates an example varactor that includes two first varactor elements, two second varactor elements, and two third varactor elements, the varactor elements having a common active region for all the varactor elements.

FIG. 5 illustrates an example varactor 10 that includes two varactor elements 12a, two varactor elements 12b, and two varactor elements 12c, varactor elements 12 with a common active region 23 for all varactor elements 12. Common active region 23 includes n-type doping. A common well 22 includes n-type doping. As another example, one or more varactor elements 12 may share a common active region 23 having a first type of doping and one or more other varactor elements 12 may share another common active region 23 having a second type of doping.

Figure 6:
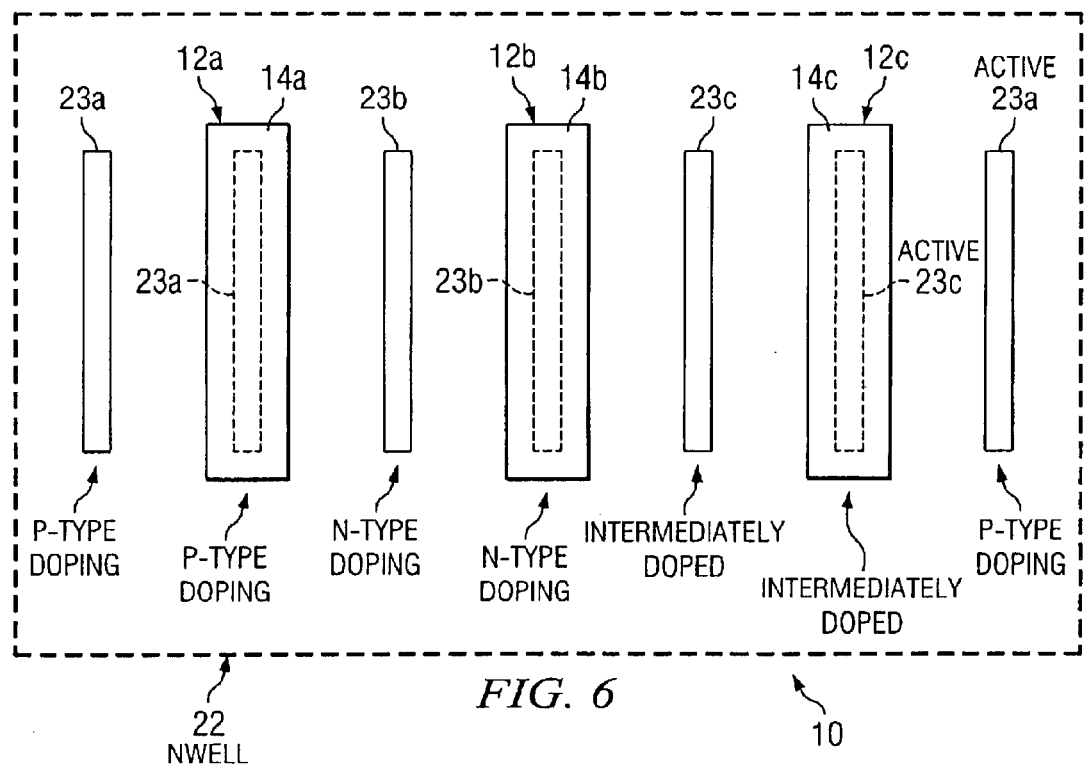
FIG. 6 illustrates an example varactor that includes one first varactor element, one second varactor element, and one third varactor element, the gate of each varactor element being larger than its active region such that its gate overlays and substantially covers its active region.

FIG. 6 illustrates an example varactor 10 that includes one varactor element 12a, one varactor element 12b, and one varactor element 12c, the gate 14 of each varactor element 12 being larger than its active region 23 such that its gate 14 overlays and substantially covers its active region 23. Additional active regions 23 may be formed between two or more of varactor elements 12. A common well 22 includes n-type doping.

Figure 7:
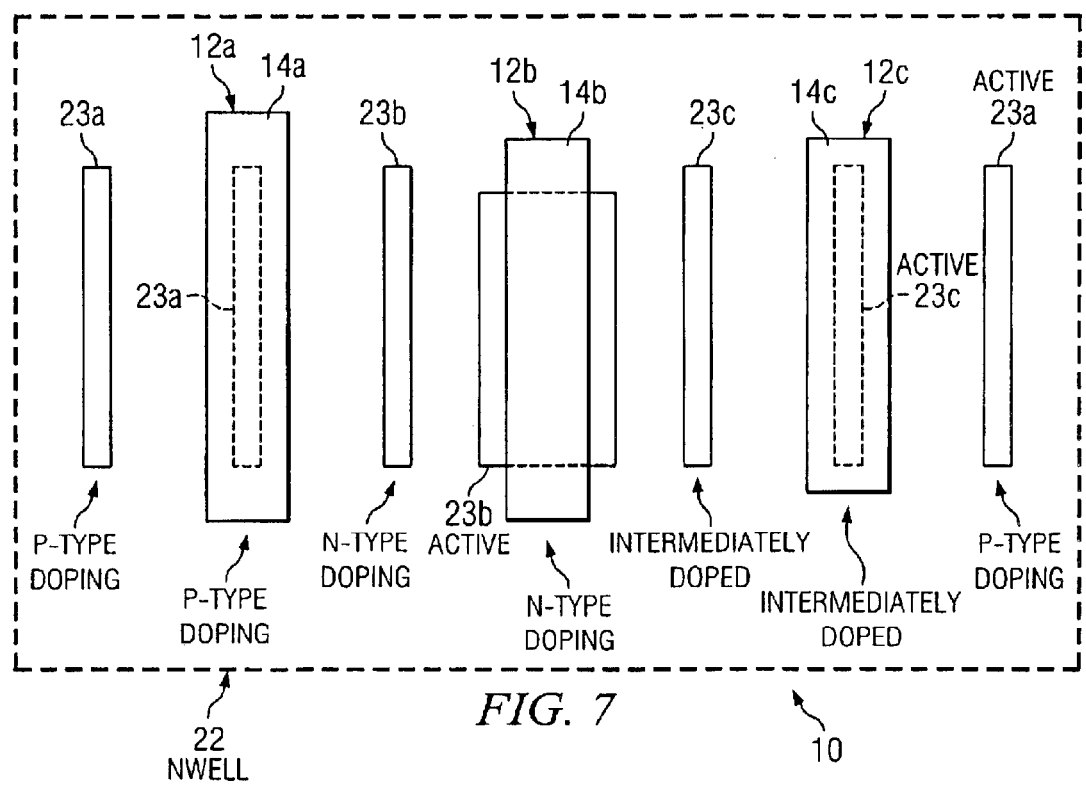
FIG. 7 illustrates an example varactor that includes varactor elements having a gate that overlays and substantially covers their associated active region and a varactor element having an active region that is wider than the gate of the varactor element.

FIG. 7 illustrates an example varactor 10 substantially similar to the example varactor 10 shown in FIG. 6. As shown in FIG. 7, however, varactor 10 includes varactor elements 12a and 12c having a gate 14 that overlays and substantially covers its associated active region 23 (e.g., the illustrated varactor elements 12a and 12c) and varactor elements 12b having an active region 23 that is wider than the gate 14 of the varactor element 12 (e.g., the illustrated varactor element 12b). A common well 22 includes n-type doping.

Figure 8:
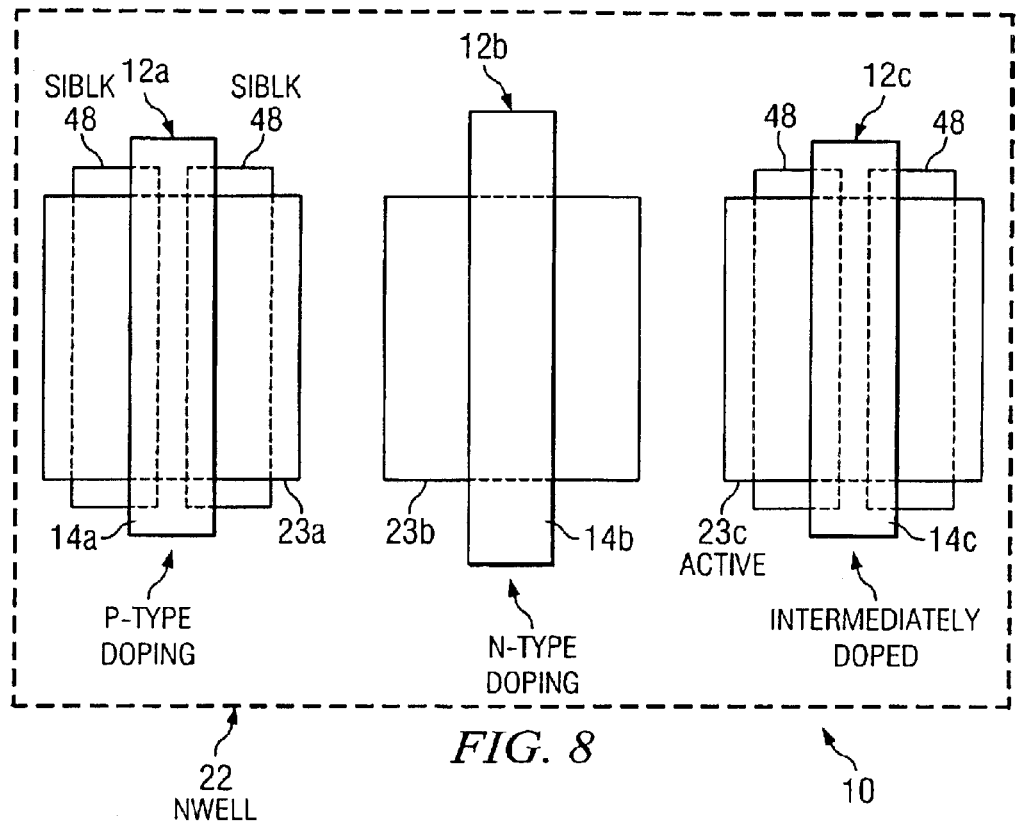
FIG. 8 illustrates an example varactor that includes one or more varactor elements in which a silicide or other dielectric block (SIBLK) has been used to block doping of one or more of the active regions and gates.

FIG. 8 illustrates an example varactor 10 that includes one or more varactor elements 12 in which a silicide or other dielectric block (SIBLK) 48 has been used to block doping of one or more of active regions 23 and gates 14. In the illustrated example, varactor 10 includes one varactor element 12a, one varactor element 12b, and one varactor element 12c. A common well 22 includes n-type doping. It may be desirable for the active region 23 of each varactor element 12 to include n-type doping. With respect to varactor element 12a, a silicide block 48 may have been used to block active region 23a from being doped with the p-type doping used to dope p-type doped gate 14a of varactor element 12a. With respect to varactor element 12c, a silicide block 48 may have been used to block active region 23c from being doped with the intermediate-type doping used to dope intermediately doped gate 14c of varactor element 12c. With respect to varactor element 12b, it may have been unnecessary or otherwise undesirable to use a silicide block 48 because active region 23b and n-type doped gate 14b share the same doping, n-type doping. While n-type active regions 23 are described as being desired in this example, active regions 23 may be blocked using suicide block 48 to yield active regions 23 having any suitable doping according to particular needs.

Figure 9:
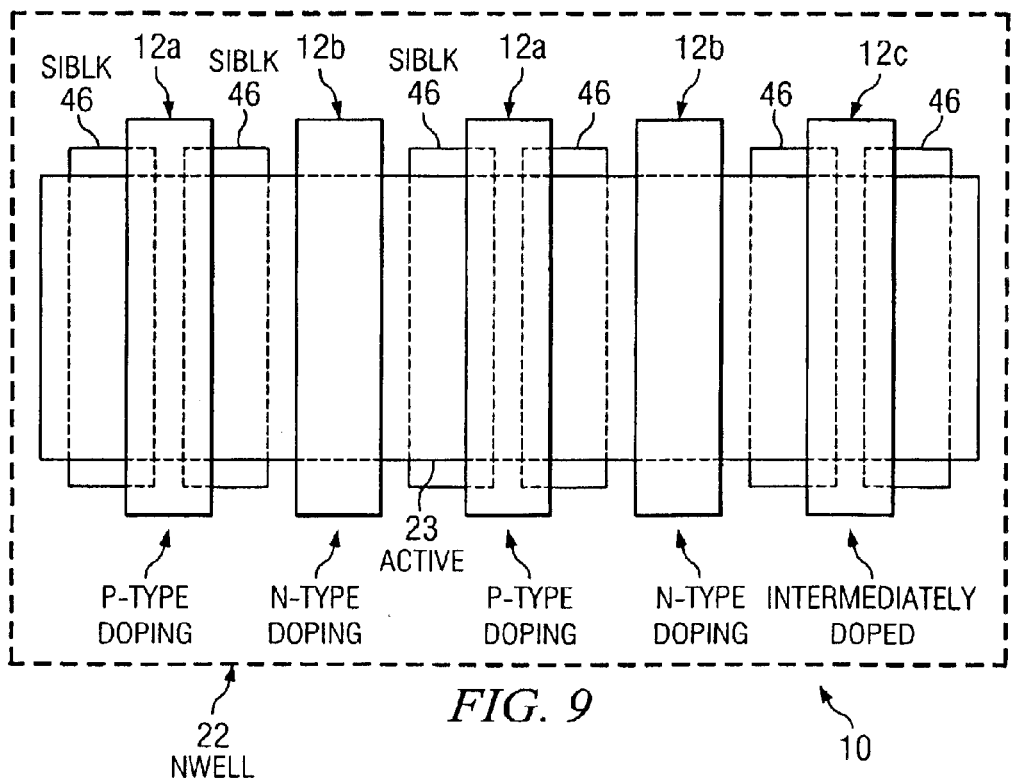
FIG. 9 illustrates an example varactor that includes a common active region, portions of which were blocked using silicide blocks.

FIG. 9 illustrates an example varactor 10 substantially similar to the example varactor 10 described above with reference to FIG. 8. The example varactor 10 illustrated in FIG. 9, however, includes a common active region 23, portions of which were blocked using silicide blocks 48.

Figure 10:
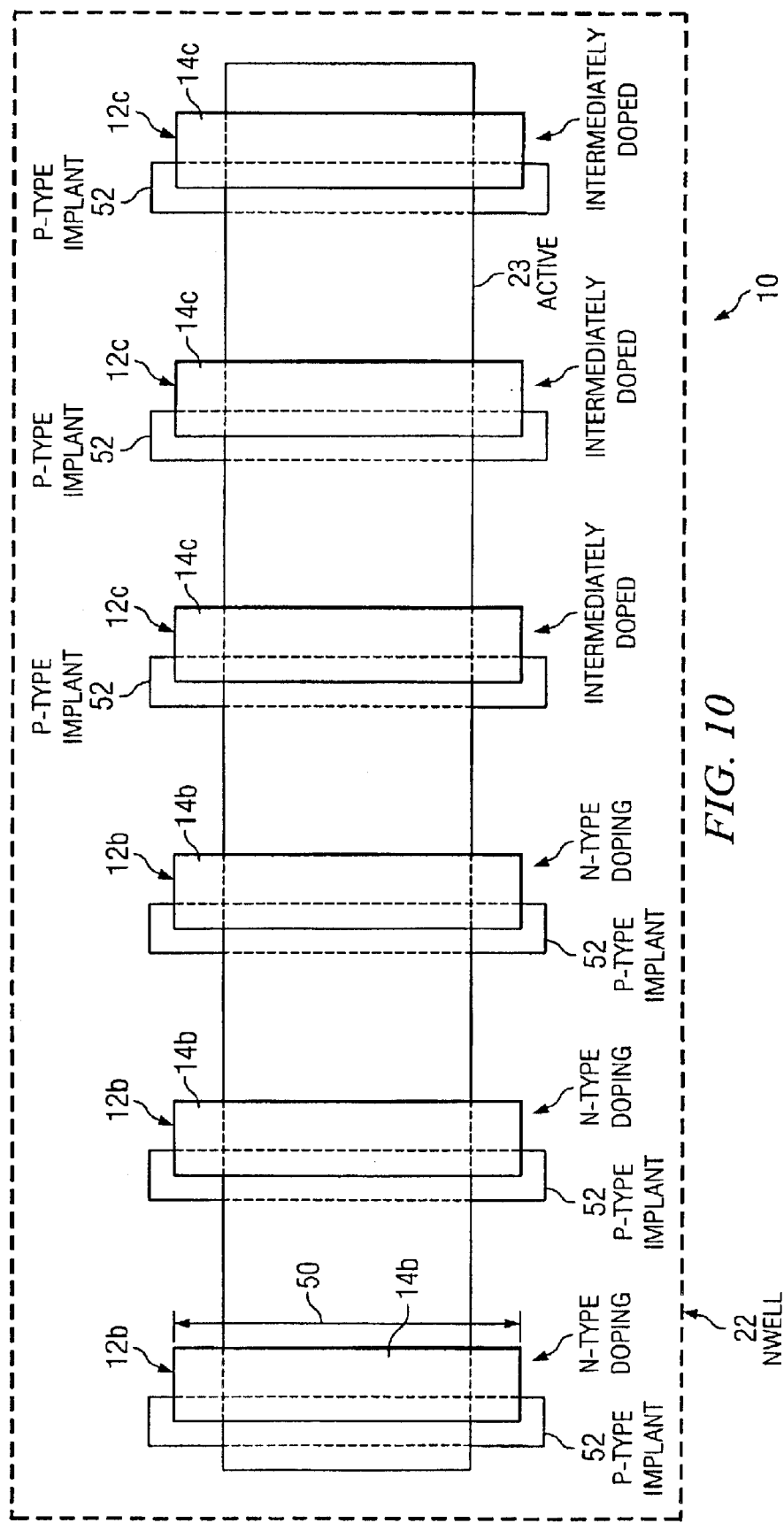
FIG. 10 illustrates an example varactor that includes varactor elements that have gates and a common active region that include more than one type of doping.

FIG. 10 illustrates an example varactor 10 that includes varactor elements 12 that have gates 14 and a common active region 23 that include more than one type of doping. The illustrated example varactor 10 is substantially similar to the example varactor 10 described above with reference to FIG. 5 in that multiple varactor elements 12 are provided that share a common active region 23. Gates 14 of varactor elements 12 and common active region 23 each include multiple types of doping. For example, gates 14b of varactor elements 12b and the portion of common active region 23 associated with varactor elements 12b may include both p-type and n-type doping along the lengths 50 of varactor elements 12. Portions of gates 14b and common active region 23 including p-type doping are indicated as portions 52. While portions 52 are described as including p-type doping, portions 52 may include p-type doping, n-type doping, intermediate-type doping, or any other suitable type of doping. The combination doping in this example may be achieved using a silicide block 48 similar to that described above with reference to FIGS. 8 and 9.

Figure 11:
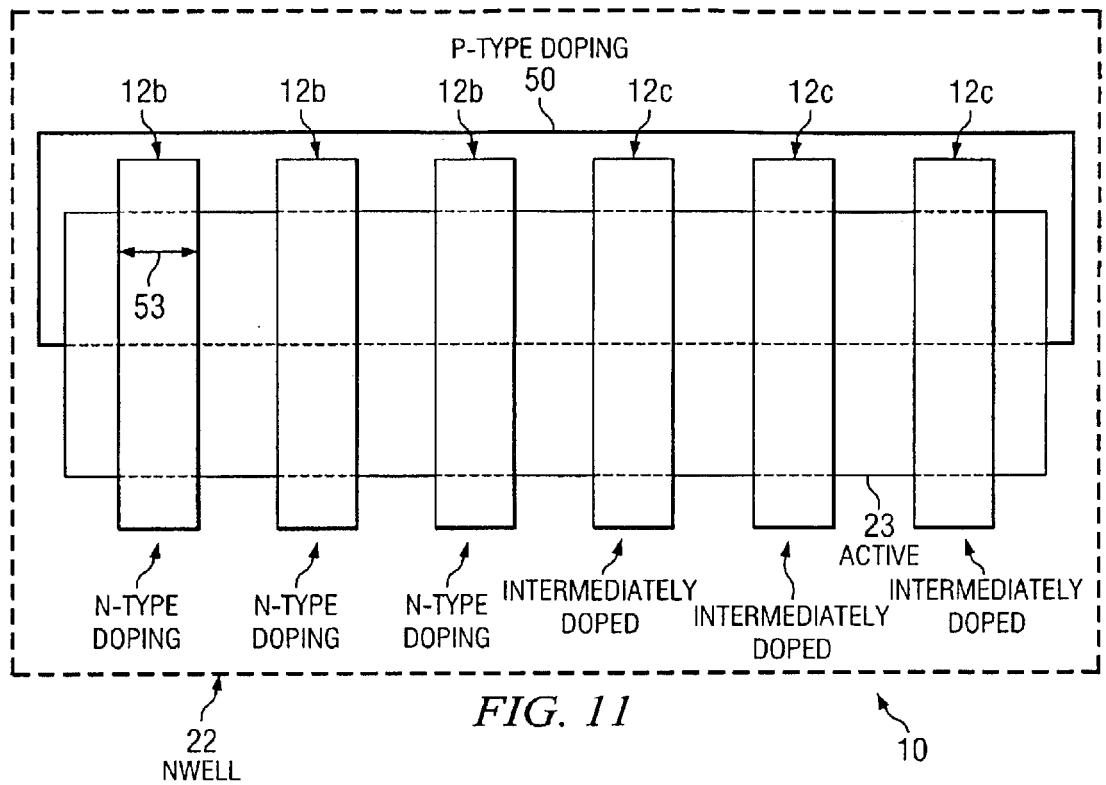
FIG. 11 illustrates another example varactor that includes varactor elements that have gates and a common active region that include more than one type of doping.
Figure 12:
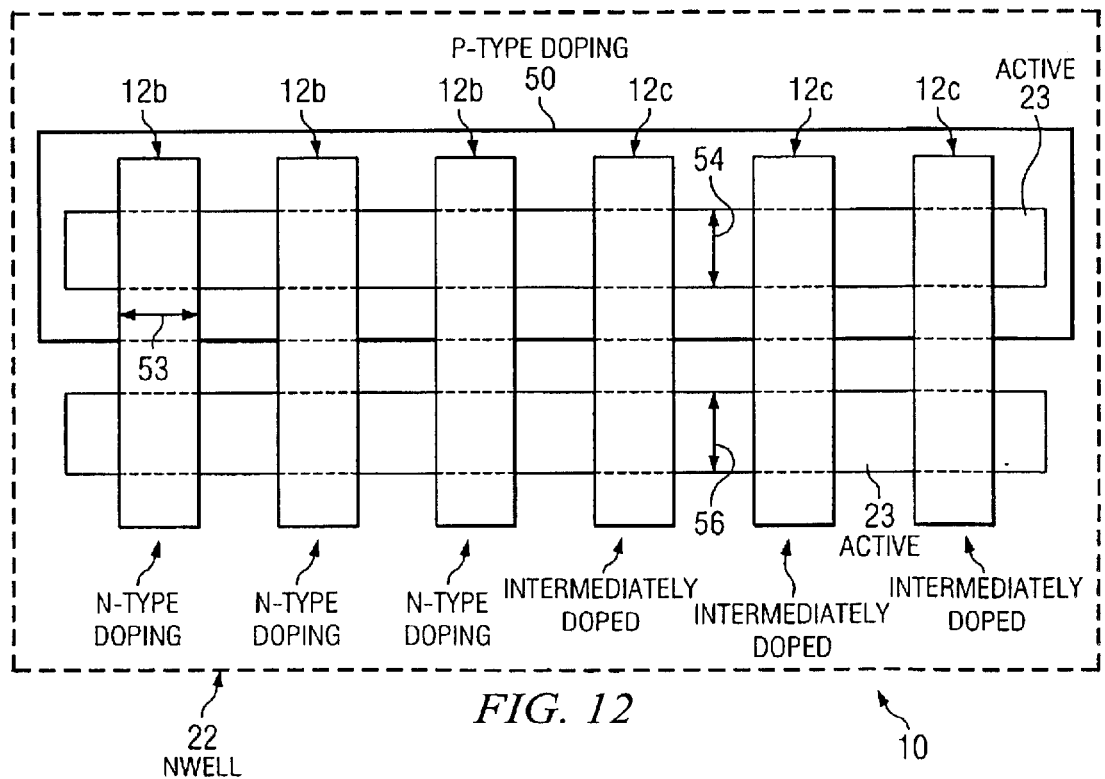
FIG. 12 illustrates an example varactor that includes varactor elements that have gates and a common active region that include more than one type of doping, the common active region being split such that a first portion of the active region includes p-type doping and a separate and non-touching second portion of the active region includes n-type doping.

FIG. 11 illustrates another example varactor 10 that includes varactor elements 12 that have gates 14 and a common active region 23 that include more than one type of doping. The multiple doping of the varactor 10 is provided along the widths 53 of the varactor elements 12. A portion of gates 14 and common active region 23 including p-type doping are indicated as portion 50. FIG. 12 illustrates an example varactor 10 substantially similar to the example varactor 10 shown in FIG. 11, except that the common active region 23 is split such that a portion 54 of active region 23 includes p-type doping and a separate and non-touching portion 56 of active region 23 includes n-type doping.

Figure 13:
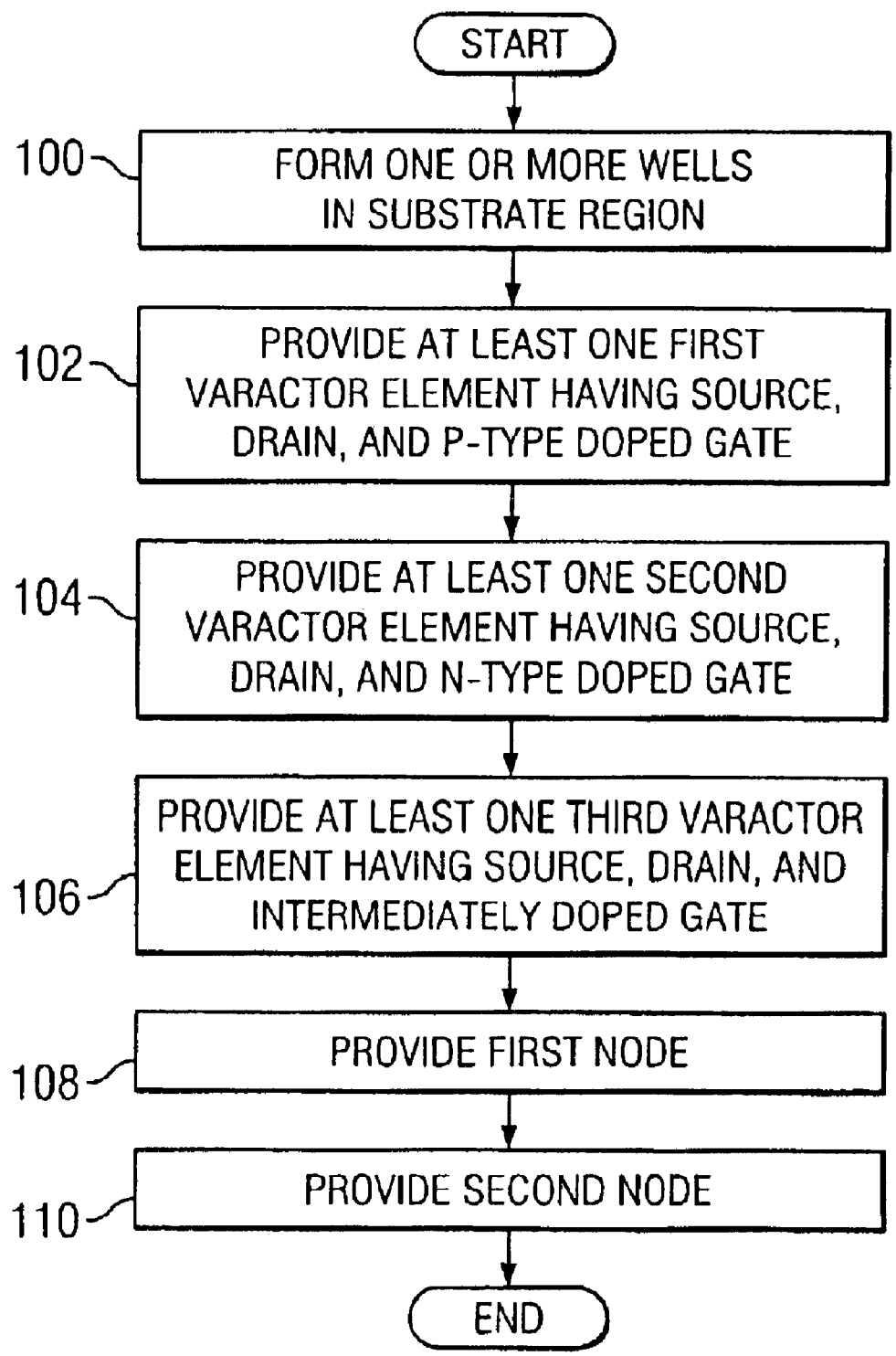
FIG. 13 illustrates an example method of manufacturing a varactor with engineered C-V characteristics.

FIG. 13 illustrates an example method of manufacturing varactor 10 with engineered C-V characteristics. At step 100, one or more wells 22 may be formed in substrate region 16 and may include p-type doping, n-type doping, or any other suitable doping characteristics. In one embodiment, it may be preferable to provide a single well 22 for varactor 10 that includes a single type of doping.

At step 102, at least one varactor element 12a may be provided, each varactor element 12a including source 18a, drain 20a, and p-type doped gate 14a. Sources 18a may include p-type doping, n-type doping, or any other suitable type of doping. Drains 20a may include p-type doping, n-type doping, or any other suitable type of doping. Source 18a and drain 20a for a particular varactor element 12a may include different doping characteristics. For each varactor element 12a, an active region 23a may include at least a portion of source 18a, at least a portion of drain 20a, and an area underlying gate 14a.

At step 104, at least one varactor element 12b may be provided, each varactor element 12b including source 18b, drain 20b, and n-type doped gate 14b. Sources 18b may include p-type doping, n-type doping, or any other suitable type of doping. Drains 20b may include p-type doping, n-type doping, or any other suitable type of doping. For each varactor element 12b, an active region 23b may include at least a portion of source 18b, at least a portion of drain 20b, and an area underlying gate 14b.

At step 106, at least one varactor element 12c may be provided, each varactor element 12c including source 18c, drain 20c, and intermediately doped gate 14c having doping characteristics intermediate to doping characteristics of p-type doped gate 14a and n-type doped gate 14b. Sources 18c may include p-type doping, n-type doping, or any other suitable type of doping. Drains 20c may include p-type doping, n-type doping, or any other suitable type of doping. For each varactor element 12c, an active region 23c may include at least a portion of source 18c, at least a portion of drain 20c, and an area underlying gate 14c. In one embodiment, two or more varactor elements 12 may share a common active region 23.

At step 108, first node 30 may be provided, and at step 110 second node 32 may be provided. In one embodiment, first node 30 may include a voltage source and second node 32 may include a ground. Varactor elements 12a, 12b, and 12c may be coupled in parallel between first node 30 and second node 32.

Although the steps of the method are described in a particular order, the steps may be performed in any suitable order according to particular needs. As an example, varactor elements 12a, 12b, and 12c may be provided in any suitable order, substantially simultaneously in whole or in part, or otherwise.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A variable reactor (varactor) with engineered capacitance-voltage (C-V) characteristics, comprising:
   a first node;
   a second node;
   at least one first varactor element comprising a source, a drain, and a p-type doped gate, the at least one first varactor element being associated with a first C-V curve;
   at least one second varactor element comprising a source, a drain, and an n-type doped gate, the at least one second varactor element being associated with a second C-V curve;
   at least one third varactor element comprising a source, a drain, and an intermediately doped gate, the intermediately doped gate having doping characteristics intermediate to doping characteristics of the p-type and n-type gates, the at least one third varactor element being associated with a third C-V curve; and
   one or more wells in a substrate region underlying the first, second, and third varactor elements;
   the first, second, and third varactor elements being coupled in parallel between the first and second nodes, the varactor exhibiting a composite C-V curve:
      reflecting a combination of the first, second, and third C-V curves when a voltage is applied between the first and second nodes;
      exhibiting an increased tuning range relative to the first C-V curve associated with the first varactor element; and exhibiting increased linearity relative to the second C-V curve associated with the second varactor element; and the varactor being associated with a total capacitance ($C_{total}$), where $C_{total}=a*n+b*p+c*i$, where a, b, and c each comprise a weight factor for engineering a predetermined composite C-V curve and where n, p, and i comprise unit capacitors for the n-type doped gate, the p-type doped gate, and the intermediately doped gate, respectively.

2. An integrated circuit providing frequency tuning within an electronic device, comprising:
a variable reactor (varactor) comprising:
a first node;
a second node;
at least one first varactor element comprising a source, a drain, and a p-type doped gate;
at least one second varactor element comprising a source, a drain, and an n-type doped gate;
at least one third varactor element comprising a source, a drain, and an intermediately doped gate, the intermediately doped gate having doping characteristics intermediate to doping characteristics of the p-type and n-type gates; and
one or more wells in a substrate region underlying the first, second, and third varactor elements;
the first, second, and third varactor elements being coupled in parallel between the first and second nodes;
one or more components operable to supply a variable voltage to the varactor; and
one or more components operable to facilitate frequency tuning according to a capacitance associated with the varactor in response to the variable voltage.

3. A variable reactor (varactor), comprising:
a first node;
a second node;
at least one first varactor element comprising a source, a drain, and a p-type doped gate;
at least one second varactor element comprising a source, a drain, and an n-type doped gate;
at least one third varactor element comprising a source, a drain, and an intermediately doped gate, the intermediately doped gate having doping characteristics intermediate to doping characteristics of the p-type and n-type gates; and
one or more wells in a substrate region underlying the first, second, and third varactor elements; and
the first, second, and third varactor elements being coupled in parallel between the first and second nodes.

4. The varactor of claim 3, wherein one or more of the following have been selected to engineer a capacitance-voltage (C-V) curve of the varactor:
the number of first varactor elements comprising p-type doped gates;
the number of second varactor elements comprising n-type doped gates;
the number of third varactor elements comprising intermediately doped gates;
the doping of the sources and drains for the first, second, and third varactor elements; and
the doping of the one or more wells.

5. The varactor of claim 3, wherein the at least one intermediately doped gate comprises an undoped gate.

6. The varactor of claim 3, wherein each of the p-type doped, n-type doped, and intermediately doped gates comprises a polysilicon gate.

7. The varactor of claim 3, wherein the source and the drain of each varactor element comprise at least one of:
p-type doping; and
n-type doping.

8. The varactor of claim 3, wherein:
the source and the drain of the first varactor element each comprises p-type doping;
the source and the drain of the second varactor element each comprises n-type doping; and
the source and the drain of the third varactor element each comprises intermediate-type doping having doping characteristics intermediate to doping characteristics of the p-type and n-type doping.

9. The varactor of claim 3, wherein the one or more wells comprise at least one of:
one or more p-type doped wells; and
one or more n-type doped wells.

10. The varactor of claim 3, wherein:
the first varactor element comprising the p-type doped gate is associated with a first capacitance-voltage (C-V) curve;
the second varactor element comprising the n-type doped gate is associated with a second C-V curve;
the third varactor element comprising the intermediately doped gate is associated with a third C-V curve; and
the varactor comprising the first, second, and third varactor elements exhibits a composite C-V curve reflecting a combination of the first, second, and third C-V curves when a voltage is applied between the first and second nodes.

11. The varactor of claim 10, wherein the composite C-V curve exhibits an increased tuning range relative to the first C-V curve associated with the first varactor element.

12. The varactor of claim 10, wherein the composite C-V curve exhibits increased linearity relative to the second C-V curve associated with the second varactor element.

13. The varactor of claim 10, wherein:
the varactor is associated with a total capacitance ($C_{total}$); and
$C_{total}=a*n+b*p+c*i$, where a, b, and c each comprise a weight factor for engineering a predetermined composite C-V curve and where n, p, and i comprise unit capacitors for the n-type doped gate, the p-type doped gate, and the intermediately doped gate, respectively.

14. A method of manufacturing a variable reactor (varactor), comprising:
providing one or more wells in a substrate region;
providing at least one first varactor element comprising a source, a drain, and a p-type doped gate;
providing at least one second varactor element comprising a source, a drain, and an n-type doped gate;
providing at least one third varactor element comprising a source, a drain, and an intermediately doped gate, the intermediately doped gate having doping characteristics intermediate to doping characteristics of the p-type and n-type gates;
providing a first node;
providing a second node; and
coupling the first, second, and third varactor elements in parallel between the first and second nodes.

15. The method of claim 14, comprising selecting one or more of the following to engineer a capacitance-voltage (C-V) curve of the varactor:
- the number of first varactor elements comprising p-type doped gates;
- the number of second varactor elements comprising n-type doped gates;
- the number of third varactor elements comprising intermediately doped gates;
- the doping of the sources and drains for the first, second, and third varactor elements; and
- the doping of the one or more wells.

16. The method of claim 14, wherein the at least one intermediately doped gate comprises an undoped gate.

17. The method of claim 14, wherein each of the p-type doped, n-type doped, and intermediately doped gates comprises a polysilicon gate.

18. The method of claim 14, wherein the source and the drain of each varactor element comprise at least one of:
- p-type doping; and
- n-type doping.

19. The method of claim 14, wherein:
- the source and the drain of the first varactor element each comprises p-type doping;
- the source and the drain of the second varactor element each comprises n-type doping; and
- the source and the drain of the third varactor element each comprises intermediate-type doping having doping characteristics intermediate to doping characteristics of the p-type and n-type doping.

20. The method of claim 14, wherein the one or more wells comprise at least one of:
- one or more p-type doped wells; and
- one or more n-type doped wells.

21. The method of claim 14, wherein:
- the first varactor element comprising the p-type doped gate is associated with a first capacitance-voltage (C-V) curve;
- the second varactor element comprising the n-type doped gate is associated with a second C-V curve;
- the third varactor element comprising the intermediately doped gate is associated with a third C-V curve; and
- the varactor comprising the first, second, and third varactor elements exhibits a composite C-V curve reflecting a combination of the first, second, and third C-V curves when a voltage is applied between the first and second nodes.

22. The method of claim 21, wherein the composite C-V curve exhibits an increased tuning range relative to the first C-V curve associated with the first varactor element.

23. The method of claim 21, wherein the composite C-V curve exhibits increased linearity relative to the second C-V curve associated with the second varactor element.

24. The method of claim 21, wherein:
- the varactor is associated with a total capacitance ($C_{total}$); and
- $C_{total} = a*n + b*p + c*i$, where a, b, and c each comprise a weight factor for engineering a predetermined composite C-V curve and where n, p, and i comprise unit capacitors for the n-type doped gate, the p-type doped gate, and the intermediately doped gate, respectively.

* * * * *